United States Patent
Cullum et al.

(10) Patent No.: US 6,963,989 B1
(45) Date of Patent: Nov. 8, 2005

(54) METHOD AND APPARATUS FOR ADJUSTING DATA HOLD TIMING OF AN OUTPUT CIRCUIT

(75) Inventors: James S. Cullum, Boise, ID (US); Steven Renfro, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/575,456

(22) Filed: May 22, 2000

(51) Int. Cl.[7] .............................. G06F 1/10; G06F 1/12
(52) U.S. Cl. ...................... 713/401; 713/400; 713/500; 713/503; 326/93
(58) Field of Search .............................. 713/401, 503, 713/400, 500; 327/40, 41; 375/356, 357; 702/89; 340/3.2, 825.2; 370/350, 503; 326/93

(56) References Cited

U.S. PATENT DOCUMENTS

| | | | |
|---|---|---|---|
| 4,903,223 A * | 2/1990 | Norman et al. | 326/39 |
| 5,258,660 A * | 11/1993 | Nelson et al. | 327/141 |
| 5,652,530 A * | 7/1997 | Ashuri | 326/93 |
| 5,692,165 A * | 11/1997 | Jeddeloh et al. | 713/400 |
| 5,822,255 A | 10/1998 | Uchida | |
| 5,852,640 A * | 12/1998 | Kliza et al. | 375/356 |
| 5,870,325 A | 2/1999 | Nielsen et al. | |
| 6,167,528 A * | 12/2000 | Arcoleo | 713/501 |
| 6,477,659 B1 * | 11/2002 | Ho | 713/503 |

FOREIGN PATENT DOCUMENTS

EP      213641 A2 *  3/1987

OTHER PUBLICATIONS

Hiroki Sutoh, Kimihiro Yamakoshi and Masajuk Ino, "Circuit Technique for Skew-Free Clock Distribution", IEEE, 1995, Custom Integrated Circuits Conference, 0-7803-2584-2/95, pp. 163-166.*
Vincent P. Heuring and Harry F. Jordan, "Computer Systems Design and Architecture", Addisson-Wesley, 1997, Page(s): 497-499.*

* cited by examiner

Primary Examiner—Lynne H. Browne
Assistant Examiner—James K. Trujillo
(74) Attorney, Agent, or Firm—Dickstein Shapiro Morin & Oshinsky LLP

(57) ABSTRACT

A method and apparatus are disclosed for adjusting the individual data hold time of data output buffers. Clock signals for the output buffers are respectively and individually adjusted for each of the output buffers to ensure a desired timing relationship among all of the data output by the buffers.

33 Claims, 5 Drawing Sheets

METHOD AND APPARATUS FOR ADJUSTING DATA HOLD TIMING OF AN OUTPUT CIRCUIT

FIELD OF THE INVENTION

The present invention relates to method and apparatus for adjusting the timing of data availability at an output buffer of a digital circuit and more particularly to a method and apparatus for individually adjusting the data hold timing of each output buffer circuit for a multi-bit data path.

BACKGROUND OF THE INVENTION

FIG. 1 illustrates a conventional output circuit for a digital circuit. To simplify discussion, this application will assume that the digital circuit is a memory circuit; however, it should be understood that the invention described herein applies to any circuit which outputs data. Data lines 11a, 11b . . . 11n each receive a respective data bit DQ0, DQ1 . . . DQn from a memory core, and provide the respective data bits to respective output buffer latches 13a, 13b . . . 13n which in turn deliver the latched output data DQ0, DQ1 . . . DQn to a plurality of output data lines 15a, 15b . . . 15n. The output buffer latches 13a, 13b . . . 13n are clocked by a clock signal which originates from a clock source 17 and is provided to the output buffer latches 13a, 13b . . . 13n in common, either directly from clock source 17, or through a delay circuit 19. The clock signal applied to the output buffer latches 13a, 13b . . . 13n causes the output buffers to latch in data from the data lines 11a, 11b . . . 11n and make it available on the output lines 15a, 15b . . . 15n for a period of time know as the data hold time, commonly referred to as $t_{oh}$.

As shown in FIG. 2 a first clock cycle is used to synchronize a READ operation which causes the data DQ0, DQ1 . . . DQn to be delivered from a memory core to the lines 11a, 11b . . . 11n and a subsequent clock cycle $T_1$ causes the output buffers to latch and hold the data on lines 11a, 11b . . . 11n for the data hold time. The time the data DQ0, DQ1 . . . DQn is accessed from memory locations and during which it is made available on lines 11a, 11b . . . 11n is commonly referred to as memory access time, $t_{ac}$.

Referring back to FIG. 1, a delay circuit 19 is often employed to ensure that data is available on all of the data input lines 11a, 11b . . . 11n before the output buffers latch and hold the data.

As the speed of digital circuits continues to increase there are ever increasing demands placed on the timing circuitry for memory devices due to shorter clock periods. In addition, the very complex circuitry of modern digital circuits, e.g., memory devices, often leads to clock signal lines being routed to the output buffer latches 13, 13b . . . 13n with unequal circuit path lengths both inside a chip and/or outside a chip in the chip packaging. As a consequence of these signal path length differences, and other timing aberrations caused by circuit topology within a chip, at higher clocking speeds, it is becoming increasingly difficult to time align the data across all the output lines 15a, 15b . . . 15c of a memory device.

SUMMARY OF THE INVENTION

The present invention is directed to a data output circuit for digital circuits, for example, memory circuits, which insures that the output data signals DQ0, DQ1 . . . DQn applied to respective data output lines are delivered in substantial coincidence. This is accomplished by individually adjusting the clock signal applied to each of a plurality of output buffer latch circuits 13a, 13b . . . 13n so that the timing of the delivery of the output signals on the output lines can be fine tuned to be substantially coincident, regardless of clock path length differences within a chip and/or within the leads of a chip package.

The invention can also be used to individually adjust the clock signals to respective output buffer circuits to deliver the output data signal DQ0, DQ1 . . . DQn to respective output data lines such that the data signals arrive substantially coincidentally at the output terminals of a packaged digital circuit, for example, a memory circuit.

The invention employs respective adjustable delay circuits in the clock path from a clock source to each of the output buffer latches so that the data hold time tOH for each output buffer latch can be individually adjusted. The amount of delay for each adjustable delay circuit may be programmable.

These and other features and advantages of the invention will be better understood from the following detailed description which is provided in connection with accompanying drawings.

DETAILED DESCRIPTION OF THE PREFERRED EMBODIMENTS

Figure 1:
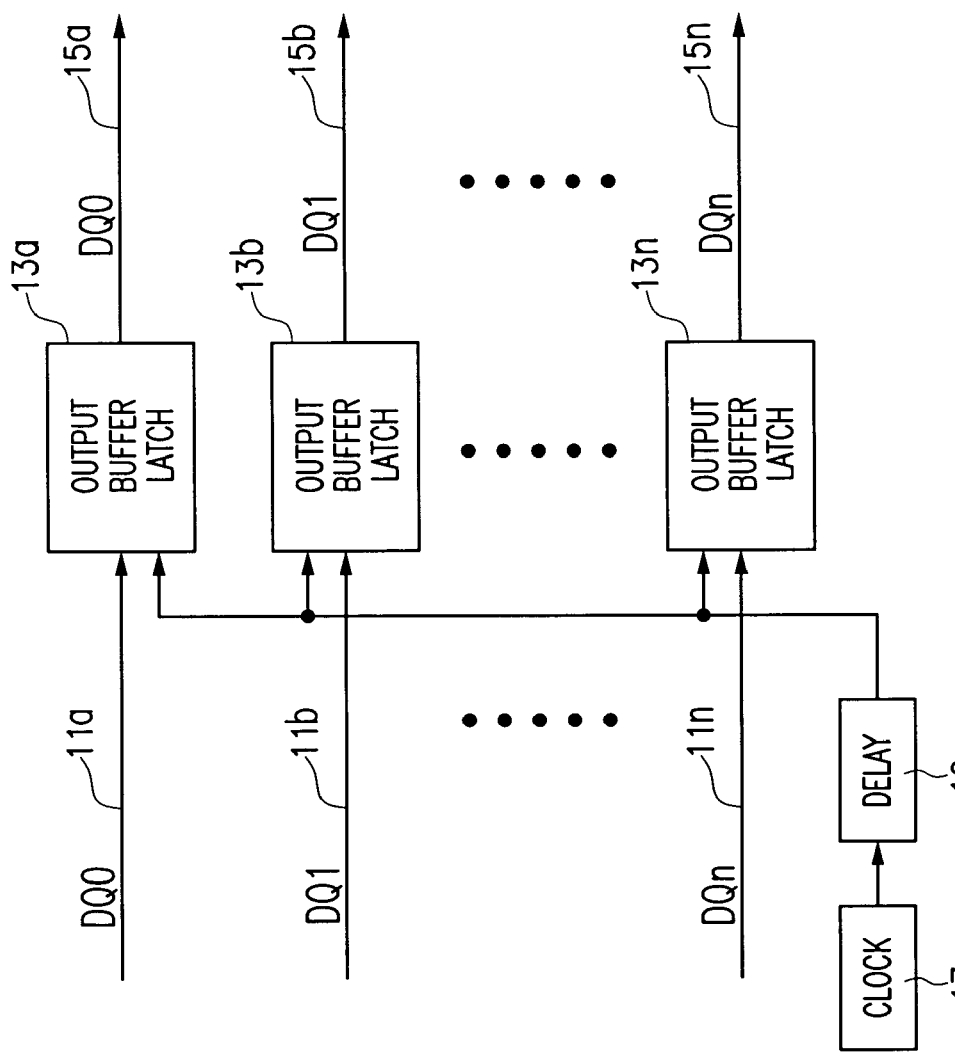
FIG. 1 illustrates a conventional data output circuit.
Figure 3:
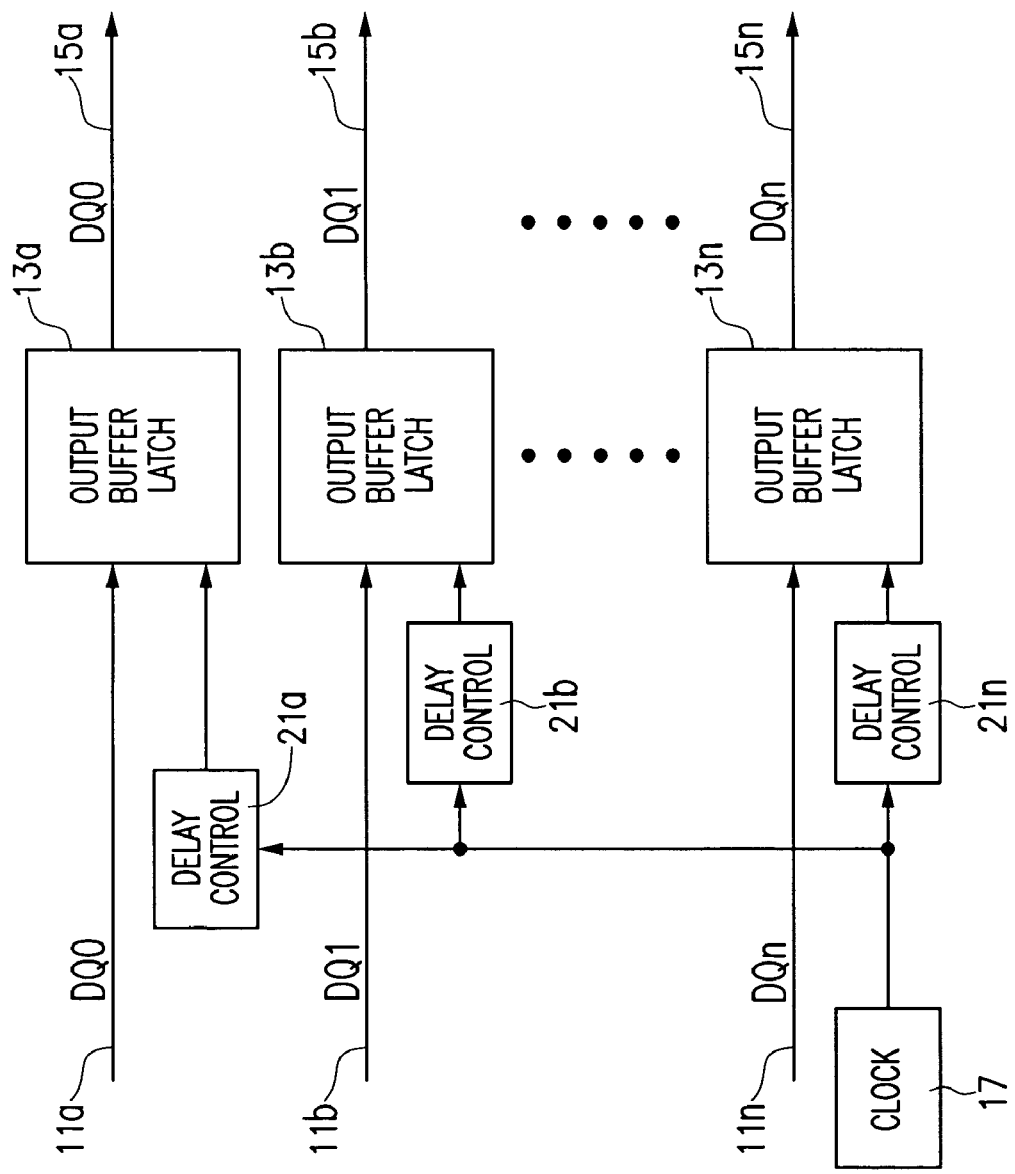
FIG. 3 illustrates a data output circuit constructed in accordance with of the invention.

FIG. 3 illustrates an embodiment of a data output circuit of the invention. Like elements to those in FIG. 1 have the same reference numbers. The FIG. 3 data output circuit permits the data hold time of the output buffer latches 13a, 13b . . . 13n to be individually adjusted by means of a respective delay control circuits 21a, 21b . . . 21n, each of which delivers a clock signal from a clock source 17 to a respective output buffer latch 13. The delay control circuits 21a, 21b . . . 21n each provide an individually adjustable delay so that the timing of the clock signals delivered from clock source 17 to the respective output buffer latch circuits 13a, 13b . . . 13n can be individually adjusted.

Figure 4:
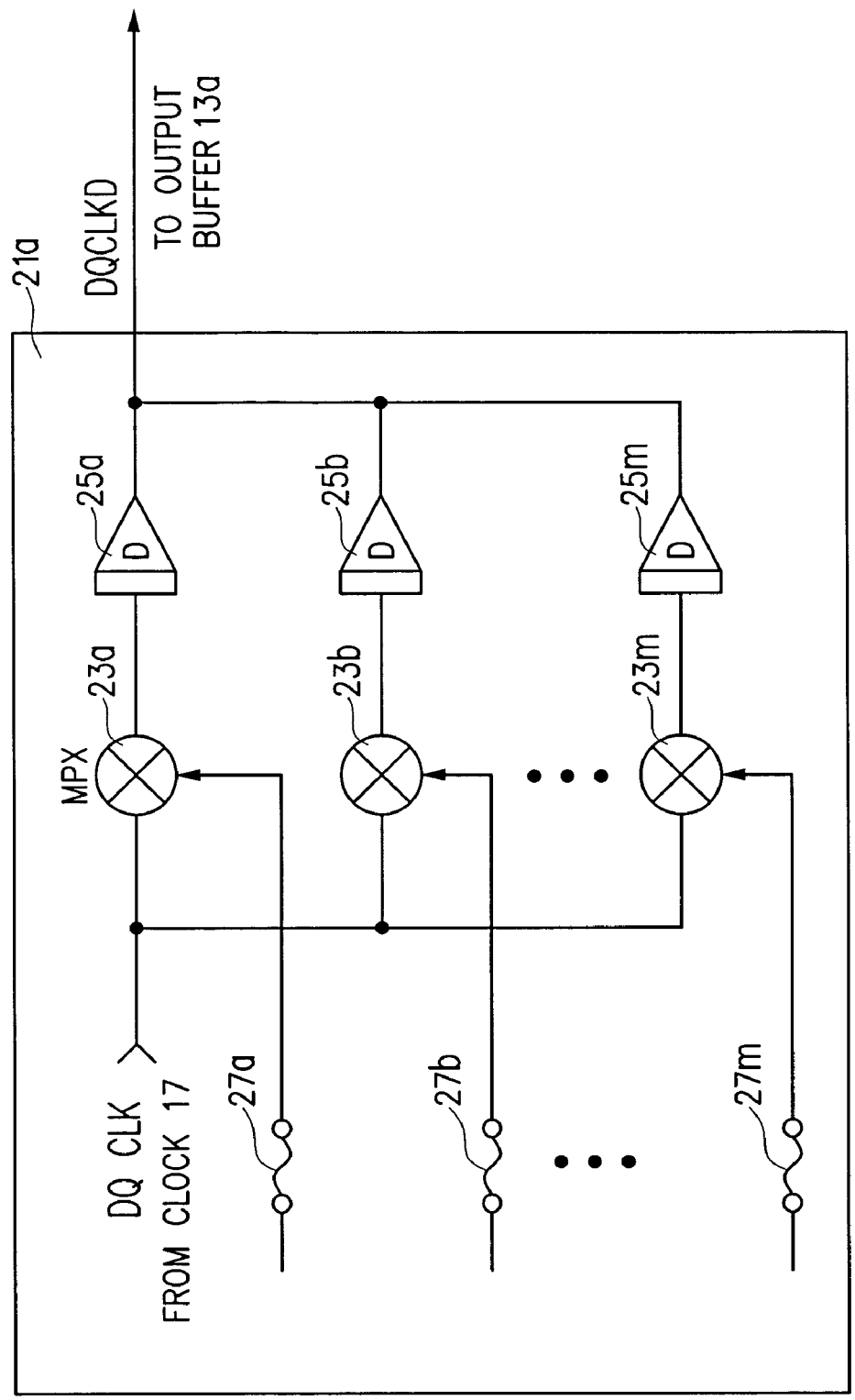
FIG. 4 illustrates the delay control circuit depicted in FIG. 3.

FIG. 4 illustrates an exemplary embodiment of one delay control circuit 21a. It should be understood that each of the delay control circuits 21b . . . 21n in FIG. 3 have an identical construction. Each delay control circuit includes a switch circuit for selecting one of a plurality of delay elements to be used to delay an applied clock signal. The switch circuit is shown in FIG. 4 as a plurality of switch element 23a, 23b . . . 23m. Each switch element 23a, 23b . . . 23m receives the incoming clock signal and is in turn connected to a respective delay element 25a, 25b . . . 25m. The delay elements are each capable of applying a different predetermined delay with respect to an input signal applied thereto. For example, delay element 25a may deliver a 0.5 nanosecond delay, delay element 25b a 1.0 nanosecond delay and delay element 25m a 1.5 nanosecond delay. It should be apparent from FIG. 4 that although three switch elements 23a, 23b . . . 23m and three associated delay elements 25a, 25b . . . 25m are illustrated that any number of switch elements and delay elements may be used. It should also be apparent that many different types of switch circuits could be used to select one of the delay elements 25a, 25b . . . 25m for delaying the applied clock signal.

As noted, the switch elements 23a, 23b . . . 23m all act as switches and the "on" state of each switch element is controlled by a signal which is applied to it through a respective fuse element or anti-fuse element, 27a, 27b . . . 27m. In practice, one of the fuse or anti-fuse elements 27a, 27b . . . 27m will be "set" relative to the others so that one of the switch elements 23a, 23b . . . 23m is "on" while the rest remain "off." As a consequence, the arriving clock signal DQCLK from clock source 17 which commonly enters each of the switch elements 23a, 23b . . . 23m is passed by the "on" switch to its corresponding delay element 25a, 25b . . . 25m thereby delivering a delayed clock signal DQCLKD to a respective output buffer 13a. The delay control circuit 21a illustrated in FIG. 4 can accordingly be programmed with the fuses or anti-fuses to set a particular clock signal delay for a particular output buffer as desired. The fused or anti-fused devices 27a, 27b . . . 27c can be programmed by the manufacturer, or by a user. If the fuses or anti-fuses are programmed by a manufacturer, the fuses or anti-fuses can be programmed during fabrication and before chip packaging. Alternatively, external pins may be provided on the chip for programming the fuses or anti-fuses by a user.

Figure 2:
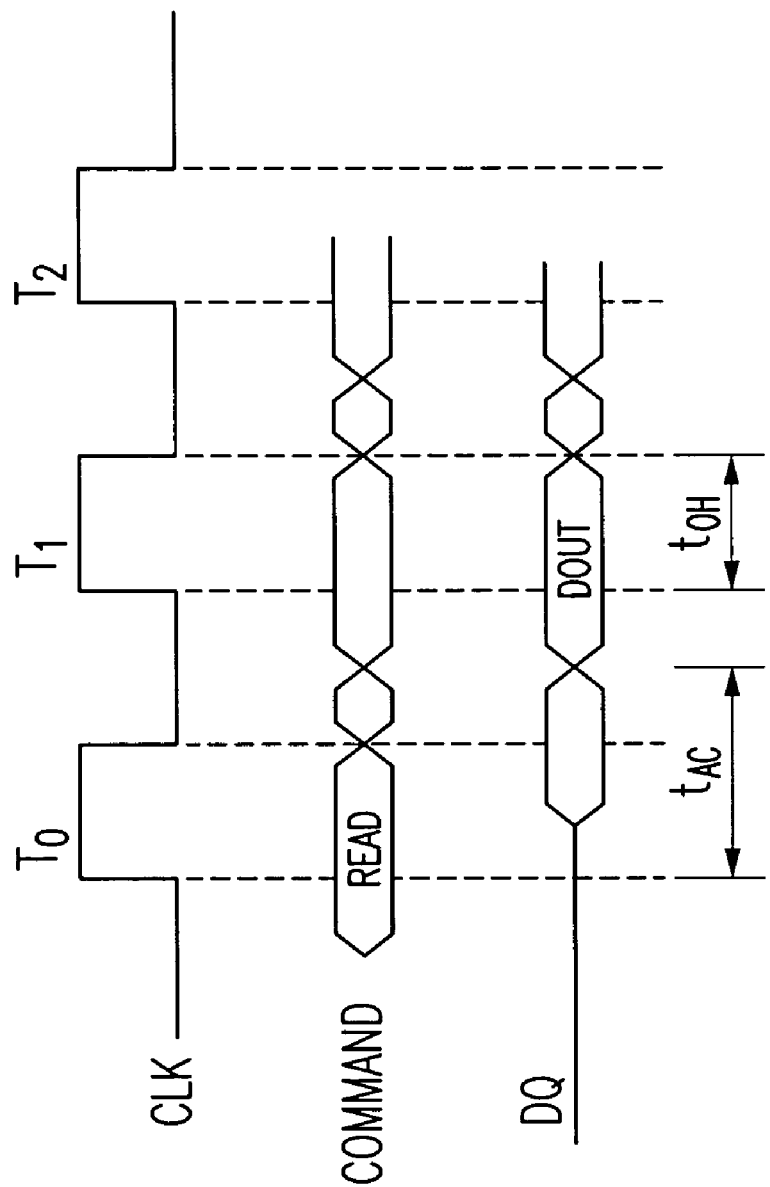
FIG. 2 illustrates a timing diagram showing operation of the FIG. 1 data output circuit.

Returning to the timing diagram of FIG. 2, the delay control circuitry 21a of the invention thus enables the data output circuit of a digital circuit, e.g., a memory circuit, to individually adjust the data hold time of each output buffer to best accommodate the clock signal path characteristics of the digital circuit and/or its packaging. As a result, the data hold times of all output buffers can be made substantially coincident, either at the output of the buffers or at the output terminals of the digital circuit.

The invention may be easily implemented as part of a digital integrated circuit. The present invention will find particular utility in a digital circuit which uses output buffers to apply data signals to a transmission path, such as a data bus, such as digital circuits employed in a processor based system of the type illustrated in FIG. 5.

Figure 5:
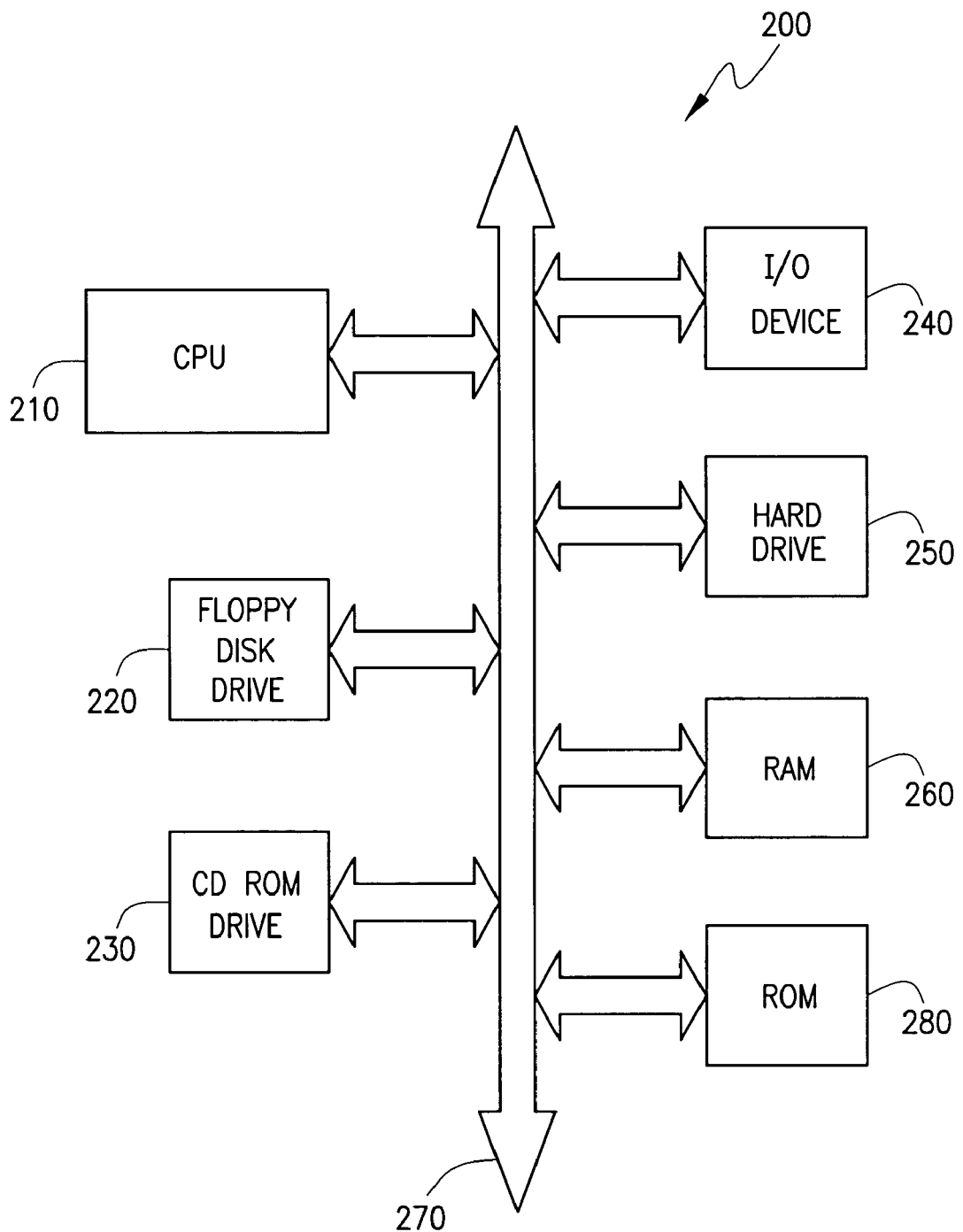
FIG. 5 illustrates a processor based system which may employ the invention.

As shown in FIG. 5, a processor based system, such as a computer system, generally comprises a central processing unit (CPU) 210, for example, a microprocessor, which communicates with one or more input/output (I/O) devices 240, 250 over a bus 270. The system 200 may also includes random access memory (RAM) 260, a read only memory (ROM) 280 and may include other peripheral devices such as a floppy disk drive 220 and a compact disk (CD) ROM drive 230 which also communicate with CPU 210 over the bus 270. At least one of CPU 210 and one or more integrated circuits connected thereto, such as employed for RAM 260 and ROM 280, may contain the data output circuit described above with reference to FIGS. 3 and 4. It is also possible to integrate the processor 210 and one or more of RAM 260 and ROM 280 on a single IC chip. FIG. 5 is one exemplary processor based architecture with which the invention may be used. Many other processor based architectures are also possible.

While a preferred embodiment of the invention has been described and illustrated above, it should be understood that this is exemplary of the invention and are not to be considered as limiting. Additions, deletions, substitutions, and other modifications can be made without departing from the spirit or scope of the present invention. Accordingly, the invention is not to be considered as limited by the foregoing description, but is only limited by the scope of the appended claims.

What is claimed as new and desired to be protected by Letters Patent of the United States is:

1. A data output apparatus comprising:
   a plurality of output circuits each of which receives and outputs a respective data signal, each said output circuit operating in response to a respective applied clock signal;
   a clock source for supplying a first clock signal; and
   a plurality of adjustable delay circuits for receiving said first clock signal, each of said adjustable delay circuits providing said respective applied clock signals to respective ones of said plurality of output circuits, wherein each adjustable delay circuit contains a programming circuit for programming a respective delay to be applied to the first clock signal, and wherein each programming circuit contains at least one fuse element for programming such that each of said respective data signals is output by said plurality of output circuits at substantially the same time.

2. A data output apparatus as in claim 1 wherein each of said output circuits has an associated output data hold time, the timing of which is adjusted by the delay of a respective delay circuit.

3. A data output apparatus as in claim 2 further comprising a plurality of data output terminals respectively connected to said output circuits, and
   wherein the delay of each of said adjustable delay circuits is adjusted such that the data hold time as seen at said respective output terminal is substantially coincident.

4. A data output apparatus as in claim 1 wherein each of said delay circuits comprises:
   an input for receiving said first clock signal;
   a plurality of delay elements, each of said delay elements providing different respective delay to a signal applied thereto; and,
   a switch circuit for selectively causing a selected one of said delay elements to delay said first clock signal and apply a delayed first clock signal to a respective output circuit.

5. A data output apparatus as in claim 4 wherein said switch circuit comprises a plurality of switch elements respectively coupled to said plurality of delay elements, one of said switch elements being selectively enabled to apply said first clock signal to its respectively coupled delay element.

6. A data output apparatus as in claim 5 further comprising a programmable circuit for programming which of said switch elements is selectively enabled.

7. A data output apparatus as in claim 1 wherein said output circuits are output buffer circuits.

8. A data output apparatus as in claim 1 wherein each of said output circuits receives and outputs a respective data signal from a memory array.

9. A data output apparatus as in claim 1, wherein each of said delay circuits comprises:
   an input for receiving said first clock signal;
   a plurality of delay elements, each of said delay elements providing different respective delay to a signal applied thereto; and,
   a switch circuit for configuring said delay elements to provide a selected delay to the delayed first clock signal.

10. A processor based system comprising:
a processor; and
at least one memory circuit coupled to said processor, at least one of said processor and memory circuit including a data output apparatus comprising:
a plurality of output circuits each of which receives and outputs a respective data signal, each said output circuit operating in response to a respective applied clock signal;
a clock source for supplying a first clock signal; and
a plurality of adjustable delay circuits for receiving said first clock signal, each of said adjustable delay circuits providing said respective applied clock signal signals to respective ones of said plurality of output circuits, wherein each adjustable delay circuit contains a programming circuit for programming a respective delay to be applied to the first clock signal, and wherein each programming circuit contains at least one fuse element for programming such that each of said respective data signals is output by said plurality of output circuits at substantially the same time.

11. A processor based system as in claim 10 wherein each of said output circuits has an associated output data hold time, the timing of which is adjusted by the delay of a respective delay circuit.

12. A processor based system as in claim 11 wherein each of said output circuits is coupled to a respective output terminal and the delay of each of said adjustable delay circuits is adjusted such that the data hold time as seen at said respective output terminal is substantially coincident.

13. A processor based system as in claim 10 wherein each of said delay circuits comprises:
an input for receiving said first clock signal;
a plurality of delay elements, each of said delay elements providing a different respective delay to a signal applied thereto; and,
a switch circuit for selectively causing a selected one of said delay elements to delay said first clock signal and apply a delayed first clock signal to a respective output circuit.

14. A processor based system as in claim 13 wherein said switch circuit comprises a plurality of switch elements respectively coupled to said plurality of delay elements, one of said switch elements being selectively enabled to apply said first clock signal to its respectively coupled delay element.

15. A processor based system as in claim 14 further comprising a programmable circuit for programming which of said switch elements is selectively enabled.

16. A processor based system as in claim 10 wherein said output circuits are output buffer circuits.

17. A processor based system as in claim 10 wherein each of said output circuits receives and outputs a respective data signal from a memory array.

18. A memory device comprising:
a memory core; and
a data output apparatus coupled to said memory core and comprising:
a plurality of output circuits each of which receives and outputs a respective data signal from said core, each said output circuit operating in accordance with a respective applied clock signal;
a clock source for supplying a first clock signal; and
a plurality of adjustable delay circuits for receiving said first clock signal, each of said adjustable delay circuits providing said respective applied clock signals to respective ones of said plurality of output circuits, wherein each adjustable delay circuit contains a programming circuit for programming a respective delay to be applied to the first clock signal, and wherein each programming circuit contains at least one fuse element for programming such that each of said respective data signals is output by said plurality of output circuits at substantially the same time.

19. A memory device as in claim 18 wherein each of said output circuits has an associated output data hold time, the timing of which is adjusted by the delay of a respective delay circuit.

20. A memory device as in claim 19, further comprising a plurality of data output terminals respectively connected to said output circuits.

21. A memory device as in claim 18 wherein each of said delay circuits comprises:
an input for receiving said first clock signal;
a plurality of delay elements, each of said delay elements providing different respective delay to a signal applied thereto; and,
a switch circuit for selectively causing a selected one of said delay elements to delay said first clock signal and apply a delayed first clock signal to a respective output circuit.

22. A memory device as in claim 21 wherein said switch circuit comprises a plurality of switch elements respectively coupled to said plurality of delay elements, one of said switch elements being selectively enabled to apply said first clock signal to its respectively coupled delay element.

23. A memory device as in claim 22 further comprising a programmable circuit for programming which of said switch elements is selectively enabled.

24. A memory device as in claim 18 wherein said output circuits are output buffer circuits.

25. A method of providing data output signals comprising:
receiving a plurality of data output signals at respective output circuits;
operating said output circuits in response to respective applied clock signals to make said data output signals available at respective outputs of said output circuits;
providing a first clock signal;
generating each of said respective applied clock signals from said first clock signal, each of said respective applied clock signals having a respective adjustable delay relative to said first clock signal;
programming each respective adjustable delay by modifying a conductive state of at least one of a fuse element and an anti-fuse element to select a delay rate; and
adjusting the delay of each of said respective applied clock signals such that the data output signals are output from said respective outputs of said output circuits at substantially the same time.

26. A method as in claim 25 wherein said data output signals are available at the outputs of said output circuits for a respective data hold time, the timing of said data hold time for each of said output circuits being independently adjusted by adjusting the delay of a respective applied clock signal.

27. A method as in claim 26 wherein the amount of delay of each of said applied clock signals is programmable.

28. A method as in claim 26, wherein each of said output circuits is connected to a respective output terminal, said method further comprising adjusting the delay of said applied clock signals such that the data hold time, as seen at each of said output terminals, is substantially coincident.

29. A method as in claim 28 wherein said terminals are exterior terminals of an integrated circuit package containing said output circuits.

30. A method as in claim 25 wherein each of said applied clock signals is generated by receiving said first clock signal and subjecting said received first clock signal to a selected one of a plurality of signal delays.

31. A data output apparatus comprising:
   a plurality of output circuits each of which receives and outputs a respective data signal, each of said output circuits operating in response to a respective applied clock signal;
   a clock source for supplying a first clock signal; and
   a plurality of adjustable delay circuits for receiving said first clock signal, each of said adjustable delay circuits providing said respective applied clock signals to respective ones of said plurality of output circuits, wherein each adjustable delay circuit contains a programming circuit for programming a respective delay to be applied to the first clock signal, and wherein each programming circuit contains at least one anti-fuse element for programming such that each of said respective data signals is output by said plurality of output circuits at substantially the same time.

32. A processor based system comprising:
   a processor; and
   at least one memory circuit coupled to said processor, at least one of said processor and memory circuit including a data output apparatus comprising:
   a plurality of output circuits each of which receives and outputs a respective data signal, each of said output circuits operating in response to a respective applied clock signal;
   a clock source for supplying a first clock signal; and
   a plurality of adjustable delay circuits for receiving said first clock signal, each of said adjustable delay circuits providing said respective applied clock signals to respective ones of said plurality of output circuits, wherein each adjustable delay circuit contains a programming circuit for programming a respective delay to be applied to the first clock signal, and wherein each programming circuit contains at least one anti-fuse element for programming such that each of said respective data signals is output by said plurality of output circuits at substantially the same time.

33. A memory device comprising:
   a memory core; and
   a data output apparatus coupled to said memory core and comprising:
   a plurality of output circuits each of which receives and outputs a respective data signal from said core, each said output circuit operating in accordance with a respective applied clock signal;
   a clock source for supplying a first clock signal; and
   a plurality of adjustable delay circuits for receiving said first clock signal, each of said adjustable delay circuits providing said respective applied clock signals to respective ones of said plurality of output circuits, wherein each adjustable delay circuit contains a programming circuit for programming a respective delay to be applied to the first clock signal, and wherein each programming circuit contains at least one anti-fuse element for programming such that each of said respective data signals is output by said plurality of output circuits at substantially the same time.

* * * * *